United States Patent [19]
Nakatani

[11] 4,084,506
[45] Apr. 18, 1978

[54] METAL MASK FOR USE IN SCREEN PRINTING

[75] Inventor: Mitsuo Nakatani, Yokohama, Japan

[73] Assignee: Hitachi, Ltd., Japan

[21] Appl. No.: 738,395

[22] Filed: Nov. 3, 1976

[30] Foreign Application Priority Data

Nov. 7, 1975  Japan ............................ 50-133096

[51] Int. Cl.² ............................................ B41F 15/36
[52] U.S. Cl. ...................................... 101/127; 29/625; 101/128.2; 118/504
[58] Field of Search .................. 101/127, 128.2, 128.3, 101/128.4, 129; 29/620, 625, 624; 118/213, 406, 504; 427/96, 272, 282; 204/11, 24

[56] References Cited
U.S. PATENT DOCUMENTS

| | | | |
|---|---|---|---|
| 2,179,220 | 11/1939 | Schneider | 101/124 |
| 3,225,691 | 12/1965 | Kehe et al. | 101/127 |
| 3,247,573 | 4/1966 | Noack | 101/127 X |
| 3,769,908 | 11/1973 | Griffin | 101/127 |

*Primary Examiner*—Ronald E. Suter
*Attorney, Agent, or Firm*—Craig & Antonelli

[57] ABSTRACT

A large sized screen plate of a metal mask type for use in printing a conductor on a thick-film-circuit substrate and the like. This metal screen comprises a metal pattern layer with pattern openings corresponding to patterns to be printed and a mesh layer made with fine metal mesh members or wires which are integrally formed on one surface of the metal pattern layer. A pattern opening corresponding to wide pattern lines to be printed is provided with the mesh layer thereover and another pattern opening corresponding to narrow pattern lines to be printed is free of the mesh layer. The metal screen thus formed enables printing of fine lines having a minimum width of 40 microns.

2 Claims, 5 Drawing Figures

METAL MASK FOR USE IN SCREEN PRINTING

BACKGROUND OF THE INVENTION

1. Field of the Invention

This invention relates to a metal mask for use in screen printing of a thick film circuit and the like.

2. Description of the Prior Art

Hitherto, there are known three masks which may be employed for screen printing: an emulsion mask for forming a pattern portion by applying a photosensitive resin to a mesh made of tetron, or synthetic fiber stainless steel or the like and then removing resin applied from unwanted portions other than portions exposed according to an exposure process; a metal mask for forming a pattern portion by depositing a metal foil on a stainless steel mesh according to an electroplating process or the like, and then subjecting part of the metal foil to pattern etching; and a solid metal mask for forming a pattern portion by integrally forming a printed pattern layer and an electro-plated layer on a substrate metal foil according to an electroplating process.

In each case of these printing masks, there is provided a mesh layer having rectangular or circular openings, which are arranged orderly, in a pattern opening portion, through which printing paste is to pass, upon printing.

FIG. 2 shows a cross-sectional view illustrative of a condition where printing paste is being transferred by using a prior art metal mask for screen printing. Shown at 1 is a substrate, at 2 a mesh layer, at 4 a substrate to be printed, at 5 paste for thick film printing, and at 6 a squeegee. For printing a thick film circuit on the substrate 4 by using thick film paste 5 and the metal mask, thick film paste 5 is placed on top of the mesh layer 2, and then pressure is applied by the squeeze 6 from above, with squeeze 6 being moved on the screen, so that the thick film paste 5 is printed at the printing pattern 3 on the substrate 4 to be printed, through the meshes of the mesh layer 2. As shown in the drawing, the thick film paste printed on the substrate 4 is difficult to be transferred to the substrate 4 at those portions under the lines or wires of the mesh layer 2, as compared with a case where the paste is transferred through the portions free of the mesh wires, with the result that the upper edges of a printed film in the portion under the lines or wires of the mesh layer 2 exhibit a wave form in its cross section. Particularly, in the case of printing of fine lines, disconnection of lines tends to take place in the edge portions of the printed film. In addition, the thickness of a printed film in a portion positioned under the lines or wires of the mesh layer 2 are reduced, as compared with that of a portion free of the lines or wires, so that there may not be achieved a printed film having a smooth surface.

SUMMARY OF THE INVENTION

It is an object of the present invention to provide a metal mask for use in screen printing, which is directed to improvements in the accuracy in the printing of a thick film circuit and the like.

It is another object of the present invention to provide a metal mask for use in screen printing which is directed to improvements in the yield rate of printed portions in the thin-line printing for a thick film circuit and the like.

According to the present invention, there is provided a metal mask for use in screen printing, in which the shape of a mesh is varied commensurate to the shape of a printing pattern, and in which an opening portion in a printing pattern layer in a single printing metal mask pattern is provided with a mesh layer covering the opening portion, and another opening portion in the single printing metal mask pattern is provided with no mesh layer.

DESCRIPTION OF THE PREFERRED EMBODIMENTS

The present invention will now be described in more detail by referring to the embodiments of the invention in conjunction with the accompanying drawings.

Figure 1:
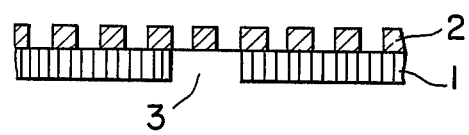
FIG. 1 is a cross-sectional view showing part of a prior art metal mask.
Figure 2:
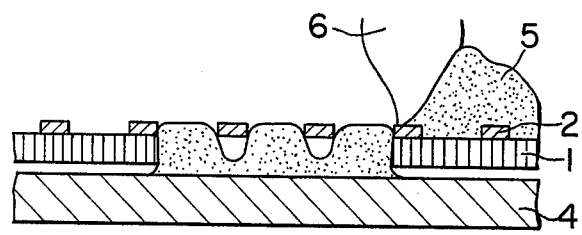
FIG. 2 is a diagrammatic cross-sectional view illustrative of the condition wherein printing paste is transferred by using the prior art metal mask of FIG. 1 for use in screen printing.
Figure 3:
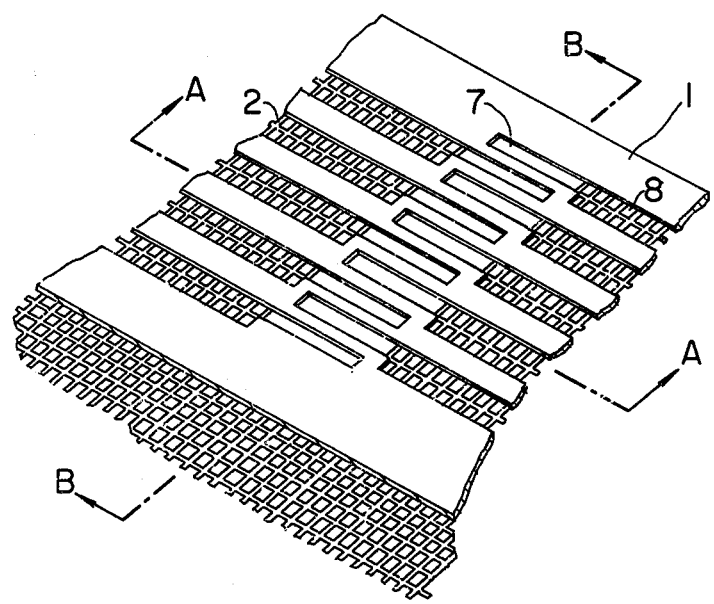
FIG. 3 is a view showing one embodiment of the invention.

FIG. 3 shows one embodiment of a metal mask according to the present invention, which finds an application to a heat-sensitive, recording type thick film module head in a smal facsimile device. FIG. 3 shows pattern opening portions 7,8 in part of a pattern. The aforesaid pattern opening portions consists of a thick line opening portion 7 having a width as small as 100 microns, and a line portion 8 having a relatively large width of 300 microns, while a mesh layer 2 is formed only over the thick line opening portion 8 having the larger width, with the portion opening 7 having the small width being free of the mesh layer. The metal mask is prepared according to the following steps: a photoresist film of a thickness of 2 to 3 microns is formed on one surface of a copper sheet 1 having a thickness 30 to 50 microns, following a desired printing pattern, while a photo-resist of the above thickness is formed on the other surface of the copper sheet 1, following a negative pattern having a mesh of a desired shape. (The diameter of a mesh line is substantially equal to the width of the line portion having a small width.) (The photo-resist film which may be employed includes, such as for instance, a trade nomenclature TPR, of Tokyo Oka make) Thereafter, electro-plating is applied to exposed portions on both surfaces of the copper sheet so as to form nickel-plated layers to a thickness of 20 to 25 microns. As a result, there are formed thereon a mesh layer 2 and pattern opening partions 7, 8 for a metal mask. Then, unwanted portions of the copper sheet are removed by using an etching solution (for instance, an chlorous acid base etching solution) in manner that the nickel plated layer is not dissolved, but the copper sheet 1 alone is dissolved. Finally, the entire body of the metal mask is nickel-plated to a thickness of 2 to 3 microns for reinforcement.

Figure 4:
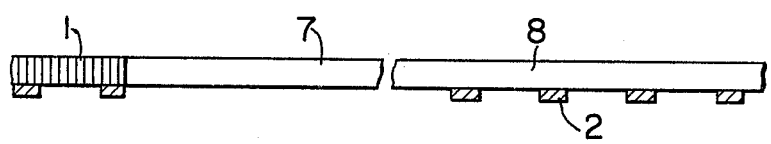
FIG. 4 is a cross-sectional view taken along the line A—A of FIG 3.
Figure 5:
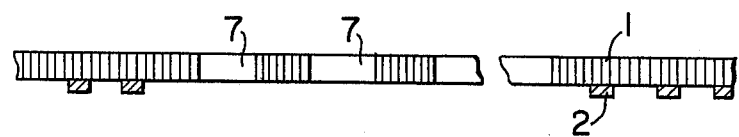
FIG. 5 is a cross-sectional view taken along the line B—B of FIG. 3.

FIGS. 4 and 5 are cross-sectional views taken along the lines A-A and B-B of FIG. 3, showing pattern opening portions 7 free of the mesh layer 2 and a pattern opening portions 8 having a mesh layer 2.

In case a conductor printing paste (for instance, a trade nomenclature 4020Y, of Sumitomo Kagaku make) is printed on an alumina substrate by using a metal mask prepared according to the process of the invention, the edges of a conductor in a fine line portion opening exhibit excellent linear contours, while being devoid of waved edges of the conductor as is printed by using a prior art metal mask having a mesh layer. As a result, the conductor prepared at fine line opening portions according to the present invention provides no risk of disconnection. In addition, unlike a printed film surface prepared by using a prior art metal mask, the printed film surface in the fine line opening portion according to the invention is free of traces of the mesh which remain in the form of islands, or built-up spots.

Tests have been given to a possible minimum width of a pattern which may be printed, by varying the mask pattern width in the opening portion free of mesh. It was found that printing is possible, as far as mask pattern widths ranging up to the maximum grain size of the printing paste used. For instance, in the case of 4020Y as used in the embodiment, a mask pattern width up to a minimum width of about 15 microns was found satisfactory for printing. In this case, the width of a conductor printed was found to be within a range of about 30 to 40 microns.

While the aforesaid embodiment includes a fine line opening portion free of the mesh layer, it is desirable that the mesh layer not be provided for a pattern having a pattern opening width of more than 100 microns but less than 300 microns. In case the opening width exceeds 300 microns, then there is a danger that the tip of the squeegee will bite into the opening of the mask pattern during printing, and the thickness of a printed conductor is reduced.

As is apparent from the foregoing, according to the present invention, a portion for which a linear edge of a conductor is particularly required in a pattern in the printing of a conductor, for instance, a portion to form a conductor of a small width, may be devoid of a mesh, thus facilitaing the printing of the aforesaid portion.

In addition, the aforesaid printed portion or a conductor is free of a narrowed or necked portion along the edge thereof, and provides smooth printed surface, so that a conductor may provide uniform electric conductivity. As a result, no local concentration of a current takes place when current flows through the conductor, thus improving the reliability of a circuit.

What is claimed is:

1. A metal mask for screen-printing comprising a metal plate having a printing pattern layer including at least one first printing pattern opening portion for forming first printed lines each having a width no larger than 300 microns and at least one second printing pattern opening portion for forming second printed lines each having a larger width than that of said first printed lines, and a mesh layer consisting of fine mesh-like lines formed on said printing pattern layer, wherein said mesh layer is provided over said second printing pattern opening portion, while said first printing pattern opening portion is free from said mesh layer.

2. A metal mesh mask for screen-printing as claimed in claim 5, wherein one surface of said printing pattern layer contacts a substrate to be printed.

* * * * *